(12) United States Patent
Doblar et al.

(10) Patent No.: US 6,640,309 B2
(45) Date of Patent: Oct. 28, 2003

(54) COMPUTER SYSTEM PROVIDING LOW SKEW CLOCK SIGNALS TO A SYNCHRONOUS MEMORY UNIT

(75) Inventors: Drew G. Doblar, San Jose, CA (US); Han Y. Ko, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/005,593

(22) Filed: Oct. 26, 2001

(65) Prior Publication Data

US 2002/0040446 A1 Apr. 4, 2002

Related U.S. Application Data

(63) Continuation of application No. 09/252,768, filed on Feb. 19, 1999, now Pat. No. 6,338,144.

(51) Int. Cl.[7] .................................................. G06F 1/04
(52) U.S. Cl. ........................ 713/400; 713/500; 713/503
(58) Field of Search ................................. 713/400, 401, 713/500, 503, 600; 711/100, 167

(56) References Cited

U.S. PATENT DOCUMENTS

| | | |
|---|---|---|
| 5,265,218 A | 11/1993 | Testa et al. |
| 5,272,664 A | 12/1993 | Alexander et al. |
| 5,339,269 A | 8/1994 | Takagi |
| 5,465,229 A | 11/1995 | Bechtolsheim et al. |
| 5,532,954 A | 7/1996 | Bechtolsheim et al. |
| 5,655,113 A | 8/1997 | Leung et al. |
| 5,754,838 A | 5/1998 | Shibata et al. |

(List continued on next page.)

FOREIGN PATENT DOCUMENTS

| | | |
|---|---|---|
| EP | 0 813 134 | 12/1997 |
| EP | 0 862 119 | 9/1998 |

OTHER PUBLICATIONS

European Search Report, Application No. 00 30 1153, mailed: Jun. 16, 2000.

$2^{nd}$ Generation SODIMM Discussion, JEDEC Task Force Meeting in San Jose, Hiatachi America, Ltd., Jan. 18, 1995 (37 pages).

*Primary Examiner*—Dennis M. Butler
(74) *Attorney, Agent, or Firm*—Meyertons Hood Kivlin Kowert & Goetzel, P.C.; B. Noël Kivlin

(57) ABSTRACT

A computer system is described including a processor for executing instructions, a memory module for storing instructions and data, and a memory controller coupled between the processor and the memory module. The memory controller provides a differential clock signal and memory access signals which are routed to the memory module. The memory module includes multiple memory devices coupled to a clock buffer. The clock buffer produces a new single-ended "regenerated" clock signal from the differential clock signal. The clock buffer includes an input buffer circuit and a phase-locked loop (PLL). The input buffer circuit receives the differential clock signal from the memory controller and produces a single-ended reference clock signal from the differential clock signal. The PLL produces the regenerated clock signal substantially at the same frequency of, and in synchronization with, the single-ended reference clock signal produced by the input buffer circuit. Each of the multiple memory devices is coupled to receive the regenerated clock signal, and the operations of the multiple memory devices are synchronized to the regenerated clock signal. The multiple memory devices within the memory module may be coupled to receive the memory access signals produced by the memory controller, and may store data or retrieve data in response to the memory access signals and the regenerated clock signal. The multiple memory devices may include synchronous dynamic random access memory (SDRAM) devices, and the memory module may be a dual in-line memory module (DIMM).

22 Claims, 4 Drawing Sheets

U.S. PATENT DOCUMENTS

| | | |
|---|---|---|
| 5,790,838 A | 8/1998 | Irish et al. |
| 5,831,890 A | 11/1998 | Selna et al. |
| 5,852,728 A | 12/1998 | Matsuda et al. |
| 5,864,246 A | 1/1999 | Anderson |
| 5,884,067 A | 3/1999 | Storm et al. |
| 6,003,118 A | 12/1999 | Chen |
| 6,005,412 A | 12/1999 | Ranjan et al. |
| 6,338,144 B2 * | 1/2002 | Doblar et al. ............... 713/400 |

* cited by examiner

COMPUTER SYSTEM PROVIDING LOW SKEW CLOCK SIGNALS TO A SYNCHRONOUS MEMORY UNIT

This application is a continuation application of U.S. patent application of Ser. No. 09/252,768, filed Feb. 19, 1999, now U.S. Pat. No. 6,338,144.

BACKGROUND OF THE INVENTION

1. Field of the Invention

This invention relates to computer systems, and more particularly to computer systems providing clock signals to synchronous memory devices.

2. Description of the Related Art

A typical computer system uses several different clock signals to synchronize system operations. Clock signals periodically transition between a low voltage level and a high voltage level, and system operations are cued to these transitions. System clock signals may include, for example, a processor clock signal, a system bus clock signal, an expansion (e.g., peripheral component interconnect or PCI) bus clock signal, and a floppy disk clock signal. A single clock generator typically generates all of the various system clock signals.

The clock signals are typically distributed to system components via various signal lines and buffers. The clock signals propagate along the signal lines at finite velocities, incurring time delays dependent upon the lengths of the various signal lines. Propagation delays of the buffers add to the propagation delays of the signal lines, resulting in "clock skew." Clock skew is the difference in time between transitions of a clock signal at the different locations of receiving components throughout the computer system.

The typical computer system includes a processor coupled to a memory unit. During operation, the processor stores data within, and retrieves data from, the memory unit. The memory unit may include synchronous dynamic random access memory (SDRAM) devices which synchronize all inputs and outputs to the processor clock signal. SDRAM devices store or "latch" incoming memory access signals in response to the processor clock signal. After the incoming memory access signals have been latched, the processor is free to handle other tasks. Following the latching of memory access signals relaying a read request, data stored within SDRAM devices is made available to the processor at output pins after a specific number of cycles of the processor clock signal. SDRAM devices also offer a number of other features which may be employed to improve the performance of the computer system, including burst mode data transfer capability.

Clock skew between the processor and a memory unit including SDRAM devices must be accounted for, and represents a period of time immediately following a transition of the processor clock signal during which no useful memory access task can be performed. As the frequency of the processor clock signal increases, the fraction of the processor clock cycle which cannot be used due to clock skew increases. In order to retain the capability to provide data to the processor in a single processor clock cycle, the speed of circuitry within the memory unit may have to be increased with any increase in processor clock signal frequency. Such faster memory devices tend to be more expensive, increasing computer system manufacturing costs.

It would thus be desirable to have a computer system employing a clock signal distribution system which reduces clock skew between the processor and a memory unit including synchronous memory devices. Such a clock signal distribution system would allow the frequency of the processor clock signal, and the performance of the computer system, to be increased without requiring faster and more expensive memory devices.

SUMMARY OF THE INVENTION

A computer system is described including a processor for executing instructions, a memory module for storing instructions and data, and a memory controller coupled between the processor and the memory module. The memory controller provides a differential clock signal and memory access signals which are routed to the memory module. The memory module includes multiple memory devices coupled to a clock buffer. The clock buffer produces a new single-ended "regenerated" clock signal from the differential clock signal. The clock buffer includes an input buffer circuit and a phase-locked loop (PLL). The input buffer circuit receives the differential clock signal from the memory controller and produces a single-ended reference clock signal from the differential clock signal. The PLL produces the single-ended regenerated clock signal substantially at the same frequency of, and in synchronization with, the single-ended reference clock signal produced by the input buffer circuit.

Each of the multiple memory devices is coupled to receive the regenerated clock signal, and the operations of the multiple memory devices are synchronized to the regenerated clock signal. The multiple memory devices within the memory module may also be coupled to receive the memory access signals produced by the memory controller, and may store data or retrieve data in response to the memory access signals and the regenerated clock signal. The multiple memory devices may include synchronous dynamic random access memory (SDRAM) devices, and the memory module may be a dual in-line memory module (DIMM).

The differential clock signal may include a pair of complementary low voltage positive emitter-coupled logic (LVPECL) signals. As defined herein, LVPECL signals are generated by emitter-coupled logic (ECL) circuits operated in positive ECL (PECL) mode using a positive power supply voltage level of less than +5.0 volts referenced to a ground power supply potential. For example, the pair of complementary LVPECL signals of the differential clock signal may be generated using a power supply voltage of +3.3 volts, and may alternate periodically between a logic high voltage level of about +2.4 volts and a logic low voltage level of approximately +1.6 volts.

The input buffer circuit may include level translation circuitry for converting the single-ended reference clock signal from a LVPECL signal to a low voltage transistor-transistor logic (LVTTL) signal. That is, the level translation circuitry may shift the logic high and logic low voltage levels of the single-ended reference clock signal from the LVPECL levels of the differential clock signal to logic high and logic low voltage levels of LVTTL signals. Following conversion from a LVPECL signal to a LVTTL signal, the single-ended reference clock signal may alternate periodically between a logic high voltage level of greater than or equal to about +2.0 volts and a logic low voltage level of less than or equal to approximately +0.8 volts.

The computer system may include n memory modules, $n \geq 1$, and each memory module may include multiple memory devices coupled to a clock buffer. The memory controller may be coupled to the processor and to each of the n memory modules. The computer system may also include a fanout buffer coupled to the memory controller and to each of the n memory modules. The memory controller may provide the differential clock signal to the fanout buffer. The fanout buffer may produce n copies of the differential clock signal, and may provide a different copy of the differential clock signal to each of the n memory modules. Each clock buffer within a given memory module may produce the single-ended regenerated clock signal as described above and provide the regenerated clock signal to the multiple memory devices within the memory module.

The fanout buffer may include multiple buffer circuits with differential inputs and differential outputs. The buffer circuits may include ECL circuits operated in PECL mode as described above. Each buffer circuit may include a differential amplifier input section and an emitter follower output section. The fanout buffer may be coupled to the memory controller and to each of the n memory modules by a different pair of signal lines having selected electrical impedances and propagation delays.

The PLL of each clock buffer may include a phase comparator, a loop filter, and a voltage-controlled oscillator (VCO) connected in series. An output of the VCO may be coupled to inputs of multiple output buffer circuits producing the regenerated clock signal. The phase comparator may have two inputs, and the reference clock signal produced by the input buffer circuit may be applied to one of the inputs of the phase comparator. An output of one of the output buffer circuits may be fed back to the other input of the phase comparator. As a result, the single-ended regenerated clock signal produced at the outputs of the output buffer circuits is substantially at the same frequency of, and in synchronization with, the single-ended reference clock signal produced by the input buffer circuit.

BRIEF DESCRIPTION OF THE DRAWINGS

Other objects and advantages of the invention will become apparent upon reading the following detailed description and upon reference to the accompanying drawings in which.

Figure 1:
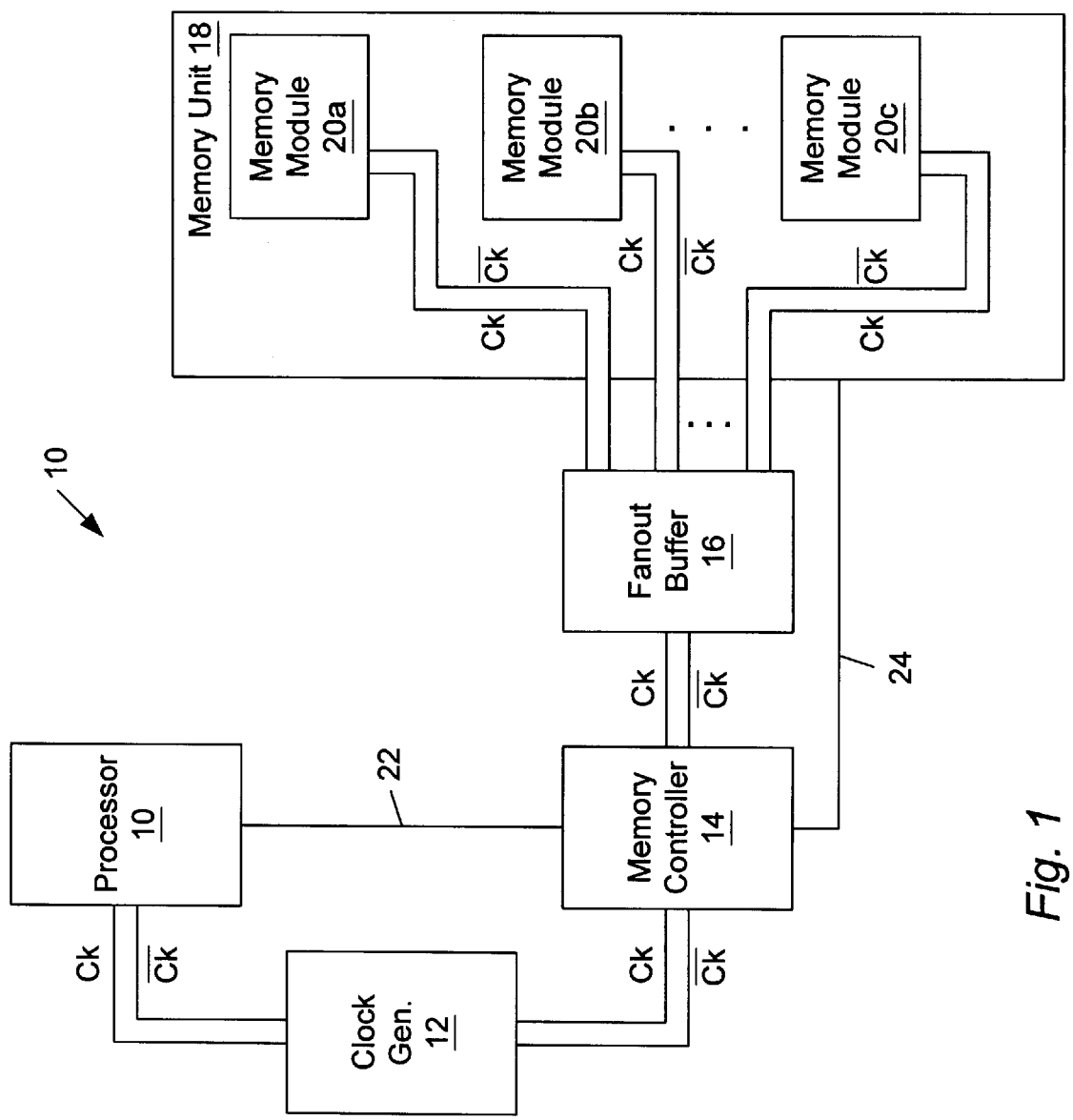
FIG. 1 is a block diagram of a computer system in accordance with the present invention, wherein the computer system includes a fanout buffer coupled between a memory controller and multiple memory modules of a memory unit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a block diagram of a computer system 10 in accordance with the present invention. Computer system 10 includes a processor 10, a clock generator 12, a memory controller 14, a fanout buffer 16, and a memory unit 18 including multiple memory modules 20a–c. Processor 10 executes software instructions during operation. The software instructions may be stored within memory unit 18, along with any associated data. Processor 10 is coupled to memory controller 14, and memory controller 14 is coupled to memory unit 18. Memory controller 14 is configured to generate memory access signals used to store data within, and retrieve data from, memory unit 18. Processor 10 accesses memory unit 18 via memory controller 14.

The operations of processor 10 are synchronized to a differential clock signal including complementary logic signals CK and CK', where signal CK' is the logical complement of signal CK. Clock generator 12 generates the differential clock signal, and routes the complementary logic signals CK and CK' of the differential clock signal to processor 10 via separate signal lines. The two signal lines conveying logic signals CK and CK' preferably have selected electrical impedances and uniform propagation delays (e.g., striplines or microstrip lines) such that signal reflections and skew are minimized.

Processor 10 may be coupled to memory controller 14 by a processor bus 22. Processor 10 may generate signals (e.g., address, data, and/or control signals) for retrieving (i.e., reading) data stored within memory unit 18 via processor bus 22, and may provide those signals to memory controller 14 via processor bus 22. Processor 10 may also provide signals for storing data within memory unit 18 to memory controller 14 via processor bus 22. Memory controller 14 may be coupled to memory unit 18 via a memory bus 24. In response to signals received from processor 10, memory controller 14 may generate memory access signals for reading data from and/or writing data to memory unit 18. Memory controller may provide the memory access signals to memory unit 18 via memory bus 24.

The operations of memory modules 20a–c within memory unit 18 are also synchronized to the differential clock signal. The differential clock signal is routed from clock generator 12 to memory unit 18 through memory controller 14. Memory controller 14 provides logic signals CK and CK' of the differential clock signal to fanout buffer 16 via separate signal lines. Fanout buffer 16 is coupled between memory controller 14 and memory modules 20a–c of memory unit 18. Fanout buffer 16 produces copies of the differential clock signal, and provides a different copy of the differential clock signal to memory modules 20a–c. Logic signals CK and CK' of the differential clock signal are routed to memory modules 20a–c via separate signal lines as shown in FIG. 1.

Figure 2:
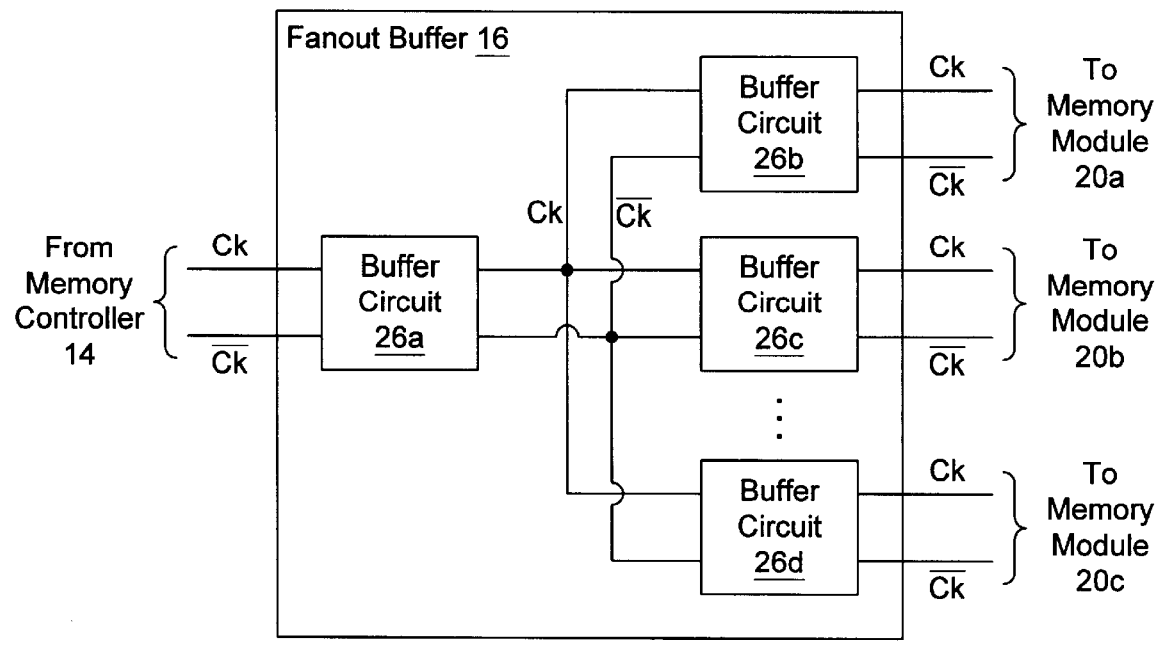
FIG. 2 is a block diagram of one embodiment of the fanout buffer of FIG. 1, wherein the fanout buffer includes multiple buffer circuits.

FIG. 2 is a block diagram of one embodiment of fanout buffer 16. In the embodiment of FIG. 2, fanout buffer 16 includes multiple buffer circuits 26a–d having differential inputs and differential outputs. Buffer circuit 26a receives the differential clock signal from memory controller 14. The differential outputs of buffer circuit 26a are routed to the differential inputs of buffer circuits 26*b–d*. The differential outputs of buffer circuits 26*b–d* are routed to memory modules 20*a–c*, respectively.

Complementary logic signals CK and CK' of the differential clock signal incur propagation delays as they travel through fanout buffer 16, and may also suffer waveform degradation (e.g., reductions in voltage rates of change during transitions, added noise, etc.). Thus the differential clock signals produced at the outputs of buffer circuits 26*b–d* are imperfect "copies" of the differential clock signal received from memory controller 14, and are also delayed in time with respect to the received differential clock signal.

Figure 3:
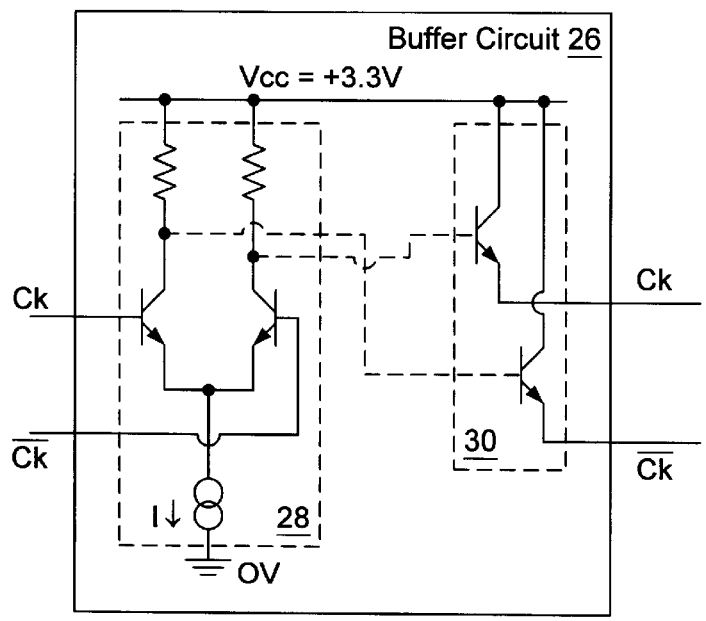
FIG. 3 is a circuit diagram of one embodiment of a buffer circuit of FIG. 2.

FIG. 3 is a circuit diagram of one embodiment of a buffer circuit 26 within fanout buffer 16. Each buffer circuit 26 may include emitter-coupled logic (ECL) circuits. The ECL circuits may include bipolar transistors, and may be operated in a positive ECL (PECL) mode as shown in FIG. 3. In PECL mode, an ECL circuit is connected to a power supply voltage which is positive in relation to a ground power supply potential. The use of ECL circuits is normally specified with bipolar transistor collectors coupled to a ground power supply potential and emitters coupled to a negative power supply potential. Operating ECL circuits in PECL mode eliminates the need to provide a negative power supply potential. ECL circuits operated in PECL mode may thus be easily integrated into circuits already providing positive power supply potentials.

The use of ECL circuits is normally specified with a negative power supply voltage of about −5.0 volts. When operated in PECL mode, specified ECL voltage levels are made positive. Thus ECL circuits operated in PECL mode normally have a positive power supply voltage of about +5.0 volts. As defined herein, the term "low voltage PECL (LVPECL) circuits" will be used to describe ECL circuits operated in PECL mode with a positive power supply voltage level of less than +5.0 volts referenced to a ground power supply potential. Signals produced by such LVPECL circuits will be referred to as "LVPECL signals."

Each buffer circuit 26 may include LVPECL circuits. For example, the bipolar transistor collectors of the ECL circuits may be coupled to a +3.3 volt power supply voltage referenced to a ground power supply potential as indicated in FIG. 3. Each buffer circuit 26 within fanout buffer 16 may include a differential amplifier input section 28 and an emitter follower output section 30. Differential amplifier input section 28 may include a pair of bipolar transistors with collectors coupled to a positive power supply voltage and emitters connected together and coupled to a ground power supply potential. Differential amplifier input section 28 may receive the complementary logic signals CK and CK' of the differential clock signal. Emitter follower section 30 may include a pair of open-emitter bipolar transistors configured to produce complementary output signals. Emitter follower section 30 may produce imperfect and time-delayed copies of logic signals CK and CK' received by differential amplifier input section 28.

It is noted that clock generator 12 may include LVPECL circuits for generating the differential clock signal. Similarly, memory controller 14 may include LVPECL circuits for receiving the differential clock signal from clock generator 12 and for providing the differential clock signal to fanout buffer 16.

All signal lines carrying complementary logic signals CK and CK' of the differential clock signal, including those between memory controller 16, fanout buffer 16, and memory modules 20*a–c*, preferably have selected electrical impedances and propagation delays. Having relatively small propagation delays and able to drive such controlled impedance transmission lines, the use of ECL circuits is highly desirable in clock signal distribution circuits. The small propagation delays of ECL helps to minimize clock signal skew in clock signal distribution circuits.

Power supply voltage levels of less than 5.0 volts are currently considered relatively low. Smaller voltage swings between logic levels permit the use of such low power supply voltage levels. Smaller logic level voltage swings are highly desirable in that they facilitate faster logic level transitions, reduce power dissipation, reduce signal cross talk between signal lines, and reduce the levels of electromagnetic interference (EMI) radiated from signal lines carrying switching signals (e.g., clock signals). Unfortunately, smaller logic level voltage swings also lower noise immunity. Here again, the use of ECL is highly beneficial. Unlike other logic families (e.g., CMOS and TTL) ECL circuits dissipate a substantially constant amount of electrical power regardless of switching frequency. As a result, ECL circuits generate and couple very little noise into power supply lines.

Having differential inputs and complementary outputs, ECL is also ideally suited for operation in differential mode. Differential signal lines are commonly routed in close proximity to one another, thus noise coupled into one of the differential signal lines is most likely coupled into the other signal line as well. In differential mode, noise which appears at both inputs of an ECL circuit, and on power supply lines, is rejected by the differential amplifier input section. As a result, noise immunity is greatly improved with the use of ECL circuits operated in differential mode. Differential mode operation also reduces signal skew by eliminating comparison of single-ended input signals to a reference voltage level which must remain highly stable.

Figure 4:
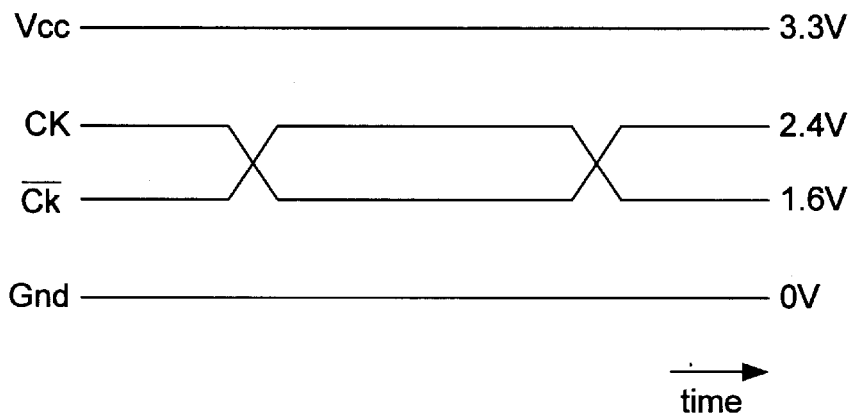
FIG. 4 is an exemplary graph of a differential clock signal produced by the multiple buffer circuits of the fanout buffer of FIG. 2 and routed to respective memory modeules, wherein the differential clock signal includes complementary logic signals CK and CK'.

FIG. 4 is an exemplary graph the differential clock signal produced by buffer circuits 26*b–d* of fanout buffer 16 and routed to respective memory modules 20*a–c*. As buffer circuits 26*b–d* may include LVPECL circuits as described above, complementary logic signals CK and CK' of the differential clock signal produced by buffer circuits 26*b–d* may be LVPECL signals. As shown in FIG. 4, logic signals CK and CK' of the differential clock signal produced by buffer circuits 26*b–d* may alternate periodically between a logic high voltage level of about 2.4 volts and a logic low voltage level of approximately 1.6 volts. It is noted the LVPECL clock signals shown in FIG. 4 may also be representative of the differential clock signal routed between clock generator 12 and memory controller 14, and between memory controller 14 and fanout buffer 16.

Figure 5:
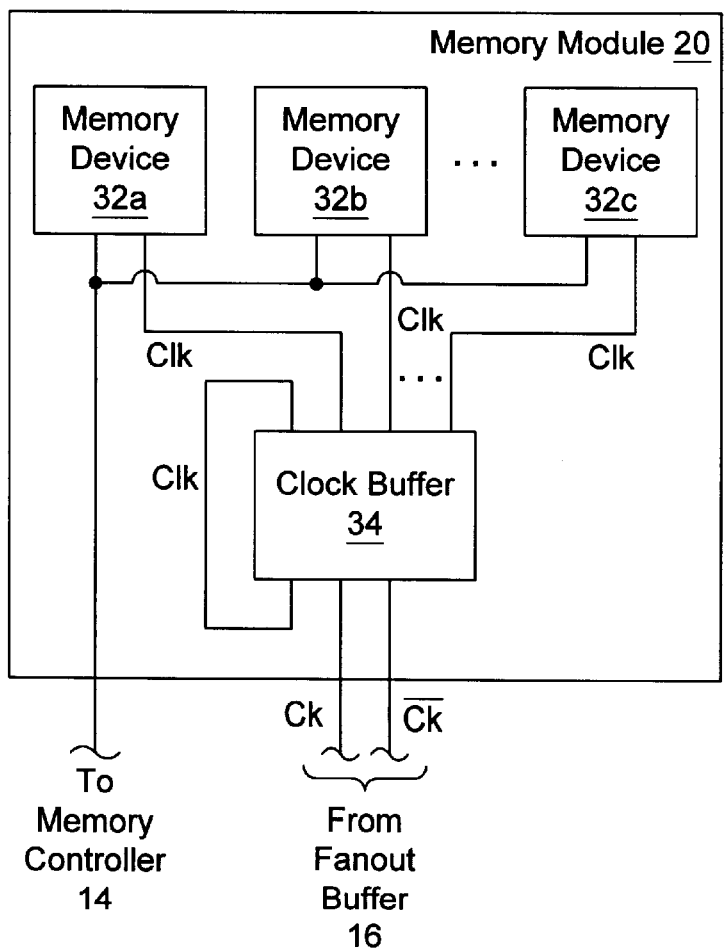
FIG. 5 is block diagram of one embodiment of a memory module of FIG. 1, wherein the memory module includes multiple memory devices coupled to a clock buffer.

FIG. 5 is a block diagram of one embodiment of a memory module 20. In the embodiment of FIG. 5, memory module 20 includes multiple memory devices 32*a–c* coupled to a clock buffer 34. Each memory device 32 is also coupled to receive memory access signals from memory controller 14 via memory bus 24.

Clock buffer 34 is coupled to receive complementary logic signals CK and CK' of the differential clock signal produced by fanout buffer 16. As will be described in detail below, clock buffer 34 produces a new single-ended clock signal CLK from the received differential clock signal. Clock buffer 34 provides copies of clock signal CLK to each memory device 32. The operations of memory devices 32 are synchronized to clock signal CLK. Memory devices 32 may be synchronous dynamic random access memory (SDRAM) devices, and memory module 20 may be a dual in-line memory module (DIMM). In the embodiment of FIG. 1, computer system 10 includes multiple memory modules 20. Computer system 10 may include, for example, 8 memory modules 20.

The use of transistor-transistor logic (TTL) circuits is widespread. The use of TTL circuits is normally specified with a positive power supply voltage of about +5.0 volts. As defined herein, the term "low voltage TTL(LVTTL) circuits" will be used to describe logic circuits with a positive power supply voltage level of less than +5.0 volts referenced to a ground power supply potential, and producing logic signals with a logic high voltage level of greater than or equal to about +2.0 volts and a logic low voltage level of less than or equal to approximately +0.8 volts. The term "low voltage TTL (LVTTL) signals" will be used to describe the logic signals produced by LVTTL circuits.

Figure 6:
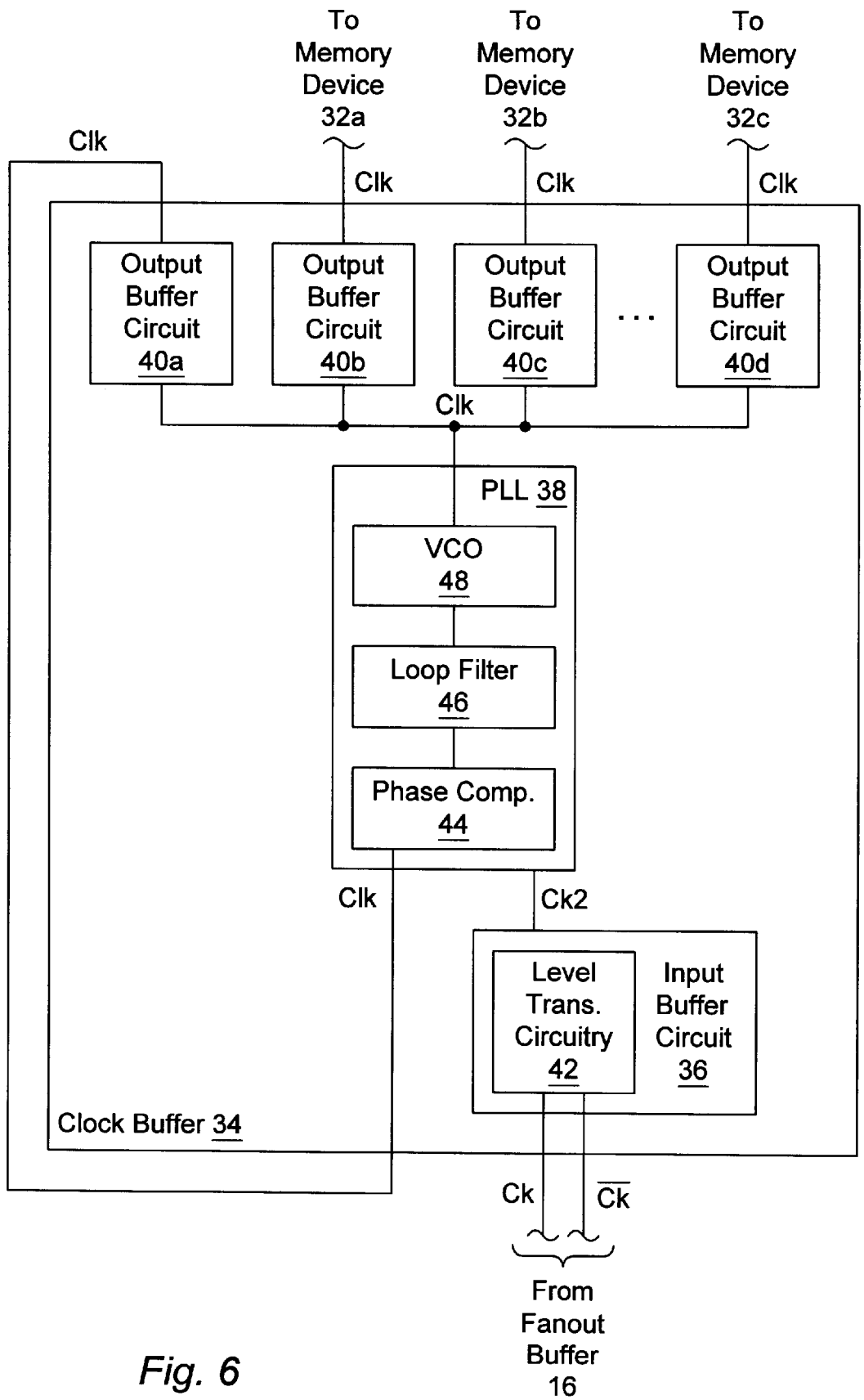
FIG. 6 is a block diagram of one embodiment of the clock buffer of FIG. 5, wherein the clock buffer includes a phase-locked loop (PLL) coupled between an input buffer circuit and multiple output buffer circuits.

FIG. 6 is a block diagram of one embodiment of clock buffer 34. In the embodiment of FIG. 6, clock buffer 34 includes a phase-locked loop (PLL) 38 coupled between an input buffer circuit 36 and multiple output buffer circuits 40a–d. Input buffer circuit 36 receives differential LVPECL clock signals CK and CK' from fanout buffer 16 and produces a single-ended clock signal CK2. Input buffer circuit 16 may include LVPECL circuits for producing a single-ended LVPECL clock signal from differential LVPECL clock signals CK and CK'. Input buffer circuit 36 may include level translation circuitry 42 for converting the single-ended clock signal from a LVPECL signal to a LVTTL signal. Level translation circuitry 42 may shift the logic high and logic low voltage levels of the single-ended LVPECL clock signal to respective logic high and logic low voltage levels of LVTTL signals, thereby producing single-ended LVTTL clock signal CK2. For example, single-ended LVTTL clock signal CK2 may be produced using a positive power supply voltage of +3.3 volts referenced to a ground potential, and may alternate periodically between a logic high voltage level greater than or equal to about +2.0 volts and a logic low voltage level of less than or equal to approximately +0.8 volts.

In the embodiment of FIG. 6, PLL 38 includes a phase comparator 44, a loop filter 46, and a voltage-controlled oscillator (VCO) 48 connected in series. VCO 48 produces the new single-ended clock signal CLK. Output buffer circuit 40a receives clock signal CLK and produces a time-delayed copy of clock signal CLK. Phase comparator 44 has two inputs. Phase comparator 44 receives the single-ended reference clock signal CK2 at one input, and the time-delayed copy of clock signal CLK produced by output buffer circuit 40a at the other input. Phase comparator 44 may produce, for example, an a.c. error signal (e.g., a square wave signal with varying duty cycle) having a short term average value substantially proportional to the difference between the phases of the reference clock signal CK2 and the time-delayed copy of clock signal CLK. Loop filter 46 may be a low pass filter which receives the a.c. error signal produced by phase comparator 44 and produces an output filtered error signal which is substantially the short term average value of the a.c. error signal. VCO 48 produces clock signal CLK such that clock signal CLK has the same frequency as reference clock signal CK2 and is in phase (i.e., synchronized) with reference clock signal CK2. Phase comparator 44, loop filter 46, and VCO 48 of PLL 38 may include LVTTL circuits and produce LVTTL signals. Thus single-ended clock signal CLK produced by VCO 48 may be a LVTTL signal.

The inclusion of PLL 38 within clock buffer 34 thus allows new single-ended clock signal CLK to be a "regenerated" copy of the single-ended reference clock signal CK2 produced by input buffer circuit 36. Output buffer circuits 40b–d provide copies of single-ended clock signal CLK to memory devices 32a–c, respectively. Any waveform degradations (e.g., reductions in voltage rates of change during transitions, elevated noise levels, etc.) present within single-ended reference clock signal CK2 do not reach memory devices 32a–c, and thus cannot disrupt their operations. As output buffer circuit 40a is included in the clock signal CLK feedback loop of PLL 38, the propagation delays of PLL 38 and output buffer circuits 40 are eliminated. Such elimination of propagation delays is advantageous in clock distribution circuits as it reduces clock skew. Clock skew reduction allows the frequencies the differential clock signal to be increased, thereby realizing a higher level of system performance. Output buffer circuits 40a–d may include LVTTL circuits, thus the copies of single-ended clock signal CLK produced by output buffer circuits 40a–d may be LVTTL signals.

Numerous variations and modifications will become apparent to those skilled in the art once the above disclosure is fully appreciated. It is intended that the following claims be interpreted to embrace all such variations and modifications.

What is claimed is:

1. A computer system, comprising:
   a processor for executing instructions;
   a memory module for storing instructions and data, wherein the memory module comprises a plurality of memory devices coupled to a clock buffer;
   a memory controller coupled between the processor and the memory module, wherein the memory controller is configured to provide a differential clock signal and to produce memory access signals;
   a fanout buffer coupled to receive the differential clock signal from the memory controller, wherein the fanout buffer includes at least one differential-pair amplifier for receiving the differential clock signal and at least one ECL (emitter coupled logic) amplifier pair for providing the differential signal to the clock buffer at ECL signal levels;
   wherein the clock buffer produces a regenerated clock signal, and wherein the clock buffer comprises:
      an input buffer circuit coupled to receive the differential clock signal and configured to produce a single-ended clock signal from the differential clock signal; and
      a phase-locked loop (PLL) for producing the regenerated clock signal substantially at the same frequency of, and in synchronization with, the single-ended clock signal; and
   wherein each of the plurality of memory devices is coupled to receive the regenerated clock signal, and wherein the operations of the plurality of memory devices are synchronized to the regenerated clock signal.

2. The computer system as recited in claim 1, wherein the differential clock signal includes a pair of complementary logic signals, and wherein the pair of complementary logic signals are low voltage positive emitter-coupled logic (LVPECL) signals.

3. The computer system as recited in claim 2, wherein the pair of complementary logic signals are LVPECL signals generated using a power supply voltage of about +3.3 volts referenced to the ground power supply potential, and the pair of complementary logic signals alternate periodically between a logic high voltage level of about +2.4 volts and a logic low voltage level of approximately +1.6 volts referenced to the ground power supply potential.

4. The computer system as recited in claim 2, wherein the input buffer circuit comprises level translation circuitry for converting the single-ended clock signal from a LVPECL signal to a low voltage transistor-transistor logic (LVTTL) signal.

5. The computer system as recited in claim 4, wherein following conversion from a LVPECL signal to a LVTTL signal, the single-ended clock signal alternates periodically between a logic high voltage level of greater than or equal to about +2.0 volts referenced to the ground power supply potential and a logic low voltage level of less than or equal to approximately +0.8 volts referenced to the ground power supply potential.

6. The computer system as recited in claim 1, wherein the plurality of memory devices are coupled to receive the memory access signals produced by the memory controller, and wherein the plurality of memory devices are configured to store data or retrieve data in response to the memory access signals and the regenerated clock signal.

7. The computer system as recited in claim 6, wherein the plurality of memory devices comprises synchronous dynamic random access memory (SDRAM) devices.

8. The computer system as recited in claim 1, wherein the memory module is a dual in-line memory module (DIMM).

9. The computer system as recited in claim 1, wherein the computer system comprises a plurality of memory modules.

10. A computer system, comprising:
  a processor for executing instructions;
  n memory modules for storing instructions and data, wherein n≧1 and wherein each memory module comprises a plurality of memory devices coupled to a clock buffer;
  a memory controller coupled to the processor and to each of the n memory modules, wherein the memory controller is configured to provide a differential clock signal and to produce memory access signals;
  a fanout buffer coupled to the memory controller and to each of the n memory modules, wherein the fanout buffer receives the differential clock signal from the memory controller, produces n copies of the differential clock signal, and provides a different copy of the differential clock signal to each of the n memory modules, wherein the fanout buffer includes a plurality of differential amplifier pairs coupled to receive the differential clock signal, including a first differential amplifier pair coupled to receive the differential clock signal from the memory controller, and a plurality of ECL (emitter coupled logic) amplifier pairs configured to provide copies of the differential clock signal at ECL signal levels, including a first ECL amplifier pair coupled to the first differential amplifier pair;
  wherein each clock buffer produces a regenerated clock signal, and wherein each clock buffer comprises:
    an input buffer circuit coupled to receive a copy of the differential clock signal from the fanout buffer and configured to produce a single-ended clock signal from the differential clock signal; and
    a phase-locked loop (PLL) for producing the regenerated clock signal substantially at the same frequency of, and in synchronization with, the single-ended clock signal; and
  wherein each of the plurality of memory devices within a given memory module is coupled to receive the regenerated clock signal, and wherein the operations of the plurality of memory devices are synchronized to the regenerated clock signal. signal from the fanout buffer and configured to produce a single-ended clock signal from the differential clock signal; and
    a phase-locked loop (PLL) for producing the regenerated clock signal substantially at the same frequency of, and in synchronization with, the single-ended clock signal; and
  wherein each of the plurality of memory devices within a given memory module is coupled to receive the regenerated clock signal, and wherein the operations of the plurality of memory devices are synchronized to the regenerated clock signal.

11. The computer system as recited in claim 10, wherein the differential clock signal includes a pair of complementary logic signals, and wherein the pair of complementary logic signals are low voltage positive emitter-coupled logic (LVPECL) signals.

12. The computer system as recited in claim 11, wherein the pair of complementary logic signals are LVPECL signals generated using a power supply voltage of about +3.3 volts referenced to the ground power supply potential, and wherein the pair of complementary logic signals alternate periodically between a logic high voltage level of about +2.4 volts and a logic low voltage level of approximately +1.6 volts referenced to the ground power supply potential.

13. The computer system as recited in claim 11, wherein the input buffer circuit comprises level translation circuitry for converting the single-ended clock signal from a LVPECL signal to a low voltage transistor-transistor logic (LVTTL) signal.

14. The computer system as recited in claim 13, wherein following conversion from a LVPECL signal to a LVTTL signal, the single-ended clock signal alternates periodically between a logic high voltage level of greater than or equal to about +2.0 volts referenced to the ground power supply potential and a logic low voltage level of less than or equal to approximately +0.8 volts referenced to the ground power supply potential.

15. The computer system as recited in claim 10, wherein the fanout buffer comprises a plurality of buffer circuits including emitter-coupled logic (ECL) circuits connected to a power supply voltage which is positive in relation to a ground power supply potential.

16. The computer system as recited in claim 15, wherein each of the plurality of buffer circuits comprises a differential amplifier input section and an emitter follower output section.

17. The computer system as recited in claim 10, wherein the fanout buffer is coupled to the memory controller and to each of the n memory modules by a different pair of signal lines having selected electrical impedances and propagation delays.

18. The computer system as recited in claim 10, wherein the PLL of each clock buffer includes a phase comparator, a loop filter, and a voltage-controlled oscillator (VCO) connected in series, and wherein an output of the VCO is coupled to inputs of a plurality of output buffer circuits, and wherein the regenerated clock signal is produced at the outputs of the plurality of output buffer circuits.

19. The computer system as recited in claim 18, wherein the phase comparator has two inputs, and wherein the single-ended clock signal produced by the input buffer circuit is applied to one of the inputs of the phase comparator, and wherein an output of one of the output buffer circuits is fed back to the other input of the phase comparator such that the regenerated clock signal produced at the outputs of the plurality of output buffer circuits is substantially at the same frequency of, and in synchronization with, the single-ended clock signal.

20. The computer system as recited in claim 10, wherein the plurality of memory devices are coupled to receive the memory access signals produced by the memory controller, and wherein the plurality of memory devices are configured to store data or retrieve data in response to the memory access signals and the regenerated clock signal.

21. The computer system as recited in claim 20, wherein the plurality of memory devices comprises synchronous dynamic random access memory (SDRAM) devices.

22. The computer system as recited in claim 10, wherein the n memory modules comprise dual in-line memory modules (DIMMs).

* * * * *

UNITED STATES PATENT AND TRADEMARK OFFICE
CERTIFICATE OF CORRECTION

PATENT NO.        : 6,640,309 B2                                  Page 1 of 1
APPLICATION NO.   : 10/005593
DATED             : October 28, 2003
INVENTOR(S)       : Drew G. Doblar and Han Y. Ko It is certified that error appears in the above-identified patent and that said Letters Patent is hereby corrected as shown below:

In the Claims:

Claim 10, col. 10, lines 2-13, please delete "signal from the fanout buffer ... regenerated clock signal".

Signed and Sealed this

Twenty-fifth Day of August, 2009

David J. Kappos
*Director of the United States Patent and Trademark Office*